United States Patent [19]

Narayan

[11] Patent Number: 5,221,411

[45] Date of Patent: Jun. 22, 1993

[54] METHOD FOR SYNTHESIS AND PROCESSING OF CONTINUOUS MONOCRYSTALLINE DIAMOND THIN FILMS

[75] Inventor: Jagdish Narayan, Raleigh, N.C.

[73] Assignee: North Carolina State University, Raleigh, N.C.

[21] Appl. No.: 682,586

[22] Filed: Apr. 8, 1991

[51] Int. Cl.⁵ ............................................. C30B 29/04
[52] U.S. Cl. ................................. 156/603; 156/610; 156/DIG. 68; 423/446; 204/197.12; 427/523
[58] Field of Search ............... 156/603, 610, DIG. 68; 427/38; 423/446; 204/192.12, 192.31; 501/86

[56] References Cited

U.S. PATENT DOCUMENTS

| | | | |
|---|---|---|---|
| 4,863,529 | 9/1989 | Imai et al. | 148/33.4 |
| 4,869,923 | 9/1989 | Yamazaki | 427/38 |
| 4,915,977 | 4/1990 | Okamoto et al. | 427/38 |
| 4,917,953 | 4/1990 | Hioki et al. | 427/38 |
| 4,997,636 | 3/1991 | Prins | 156/DIG. 68 |

FOREIGN PATENT DOCUMENTS

| | | | |
|---|---|---|---|
| 206820 | 12/1986 | European Pat. Off. | 423/446 |
| 1476313 | 6/1977 | United Kingdom | 423/446 |

OTHER PUBLICATIONS

Current Issues and Problems in the Chemical Vapor Deposition of Diamond, Walter Yarborough and Russell Messier, Science, vol. 247, pp. 688 to 696, Feb. 9, 1990.

Molecule of the Year, Editorial, Science, vol. 250, pp. 1637 to 1641, Dec. 9, 1990.

Diamond—Ceramic Coating of the Future, Karl Spear, J. Am. Ceram. Soc., vol. 72, No. 2, pp. 171 to 191, 1989.

I. Amato, "Fanning the Hope for Flat Diamond," Research News, 375 (Apr. 19, 1991).

J. Narayan et al., "Laser Methods for Synthesis and Processing of Continuous Diamond Films on Nondiamond Substrates," Science 252, 416–418 (1991).

Robertson et al, "Epitaxial Growth of Diamond Films on Si(III) at Room Temperature by Mass-Selected Low Energy (+Beams", Science, vol. 243 Feb. 24, 1989 pp. 1047–1050.

Primary Examiner—Robert Kunemund
Attorney, Agent, or Firm—Bell, Seltzer, Park & Gibson

[57] ABSTRACT

Disclosed is a method for the development of diamond thin films on a non-diamond substrate. The method comprises implanting carbon ions in a lattice-plane matched or lattice matched substrate. The implanted region of the substrate is then annealed to produce a diamond thin film on the non-diamond substrate. Also disclosed are the diamond thin films on non-diamond lattice-plane matched substrates produced by this method. Preferred substrates are lattice and plane matched to diamond such as copper, a preferred implanting method is ion implantation, and a preferred annealing method is pulsed laser annealing.

20 Claims, 6 Drawing Sheets

METHOD FOR SYNTHESIS AND PROCESSING OF CONTINUOUS MONOCRYSTALLINE DIAMOND THIN FILMS

FIELD OF THE INVENTION

This invention relates to monocrystalline diamond thin films on non-diamond substrates and methods for producing the same.

BACKGROUND OF THE INVENTION

The mechanical, electrical, optical, chemical and thermal properties of diamond make the creation of diamond thin films desirable for many applications. Such films are sought for applications ranging from wear-resistant coatings to substrates for semiconductor devices See Editorial, "Molecule of the Year," Science 250, 1637, 1640-41 (Dec. 21, 1990). Currently, however, diamond thin films are only created using vapor deposition techniques and only as polycrystalline films. See W. Yarbrough and R. Messier, Current Issues and Problems in the Chemical Vapor Deposition of Diamond, Science 247, 688-96 (Feb. 9, 1990).

Diamond thin films have been successfully grown by a variety of low pressure and low temperature chemical vapor deposition (CVD) methods, such as filament assisted CVD, plasma CVD, and combustion flames. See Devaries, Ann. Rev. Mater. Sci. 17, 161 (1987); Matsumoto et al, J. Mat. Sci. 18, 1823 (1988). In these methods, typically a mixture of hydrocarbons such as $CH_4$ and $C_2H_2$ and hydrogen (98-99.5% by volume) is passed over heated (700°-1000° C.) substrates such as silicon, nickel, copper, tungsten, and silicon carbide. During the process, both diamond and graphite are deposited. However, preferential etching of graphite by hydrogen leaves diamond crystallites which grow further to form polycrystalline films. Single crystal diamond thin films have been grown epitaxially only on diamond substrates, where all three axes of the film are aligned with respect to the underlying substrate (see Geis et al, IEEE-Electron Device Lett. EDL-8, 341 (1987); M. W. Geis, Materials Res. Soc. Pro., 162, 15 (1990)).

A single crystal diamond substrate was reported as epitaxially grown using CVD on a silicon (Si) substrate having a silicon carbide (SiC) intermediate layer by Imai et al in U.S. Pat. No. 4,863,529. However, a SiC intermediary layer tends to be produced any time a diamond film is grown using CVD on a Si substrate. See Spear, Diamond—Ceramic Coating of the Future, J. Am. Ceram. Soc., 72(2) 171-191 (1989). The CVD method described required high pressures and high temperatures and deposited a diamond thin film onto a SiC intermediate layer. Typically the diamond resulting from CVD methods contains defects such as twins and stacking faults.

In view of the foregoing, an object of the present invention is to provide a novel method for forming diamond thin films which overcomes problems inherent in conventional CVD techniques.

SUMMARY OF THE INVENTION

The present invention uses a novel method to produce continuous, single crystal diamond thin films on non-diamond substrates such as single crystal copper. The method comprises producing a monocrystalline diamond film on a non-diamond substrate by providing a substrate having a carbon implanted region therein, where the substrate is lattice-plane matched with diamond, and then annealing the implanted region to produce a monocrystalline diamond film on the substrate.

A further method of producing a monocrystalline diamond film on a non-diamond substrate which is lattice-plane matched with diamond comprises implanting carbon ions in a region of a non-diamond substrate using ion implantation of a dose of from about 1 to $3 \times 10^{18}$ ions/$cm^2$ with an energy of from about 60 KeV to 300 MeV, and then pulsed laser annealing the implanted region with sufficient energy to melt the implanted region but insufficient to cause vaporization of the implanted region, to produce a monocrystalline diamond film on the substrate.

The present invention provides a thin film monocrystalline diamond structure comprising a non-diamond substrate and a monocrystalline diamond film formed on the non-diamond substrate. The non-diamond substrate may be formed from a material selected from the group consisting of copper, nickel and iron.

The present invention further provides a thin film monocrystalline diamond structure, comprising a non-diamond substrate and a monocrystalline diamond film formed on the non-diamond substrate. The non-diamond substrate is comprised of a material which is lattice-plane matched with the monocrystalline diamond film. The structure further comprises a boundary layer between the diamond film and the substrate having an upper region contacting the diamond film and a lower region contacting the non-diamond substrate, where the boundary layer comprises a carbon distribution in the substrate material which continuously shifts from high concentration in the upper region to low concentration in the lower region.

The present invention further provides a thin film monocrystalline diamond structure, comprising a non-diamond substrate and a monocrystalline diamond film formed from carbon implanted within the non-diamond substrate, where the non-diamond substrate is comprised of a material which is lattice-plane matched with the monocrystalline diamond film.

While applicant does not wish to be bound to any particular theory underlying this invention, it is believed that, during this process, implanted carbon atoms cluster and form the diamond phase. Thin films grown by this method have been characterized by SEM, TEM, X-ray diffraction, Rutherford backscattering and channeling, Augur spectroscopy and Raman spectroscopy and found to be monocrystalline.

DETAILED DESCRIPTION OF THE INVENTION

Figure 1:
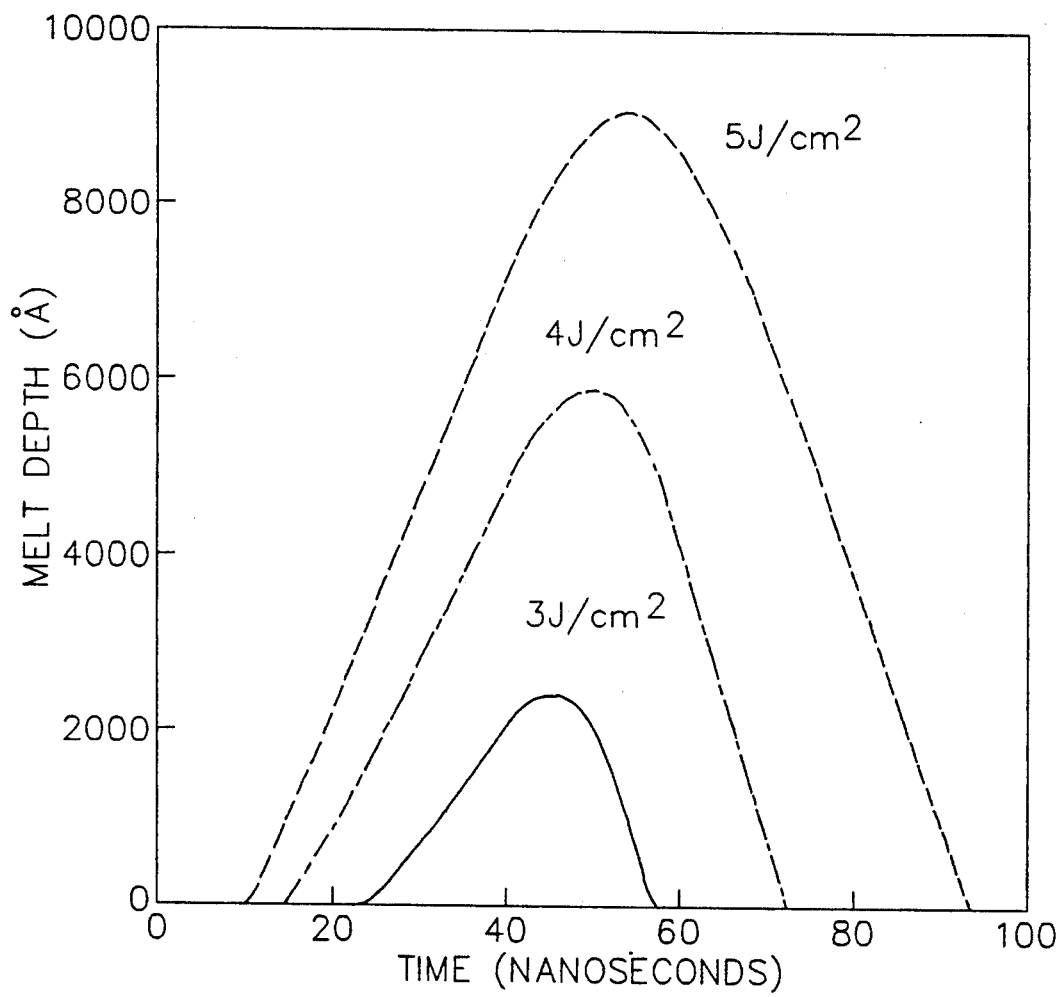
FIG. 1 illustrates the melt depth of carbon implanted copper for selected energy densities using a pulsed laser.
Figure 2A:
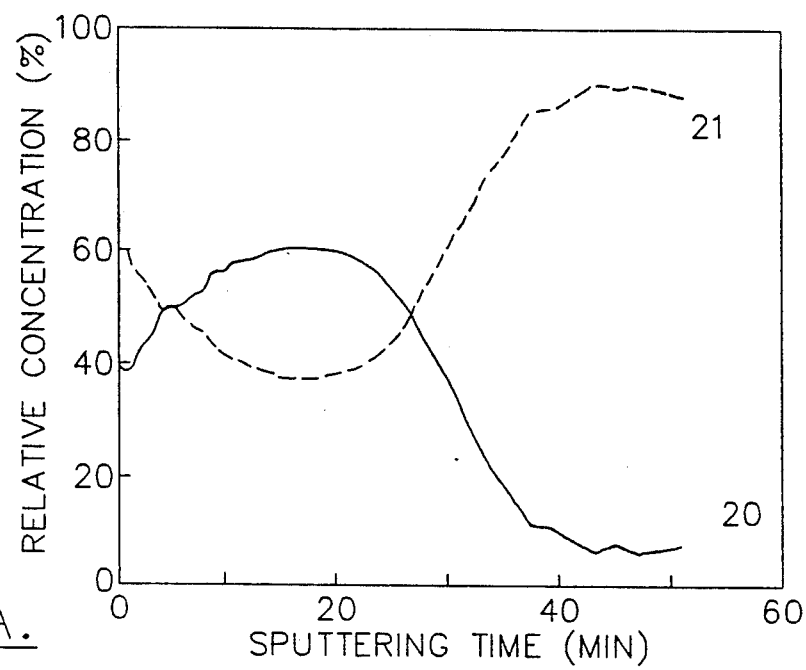
FIG. 2(a-d) illustrates the distribution of carbon atoms after ion implantation, before and after laser annealing, and characteristic spectra as found by Auger spectroscopy. 2(a) shows the carbon distribution in the substrate before laser annealing. 2(b) and 2(c) show the carbon distribution after pulsed laser annealing with energy densities of 3 J/$cm^2$ and 5 J/$cm^2$ respectively. 2(d) illustrates characteristic carbon and diamond spectra.
Figure 2B:
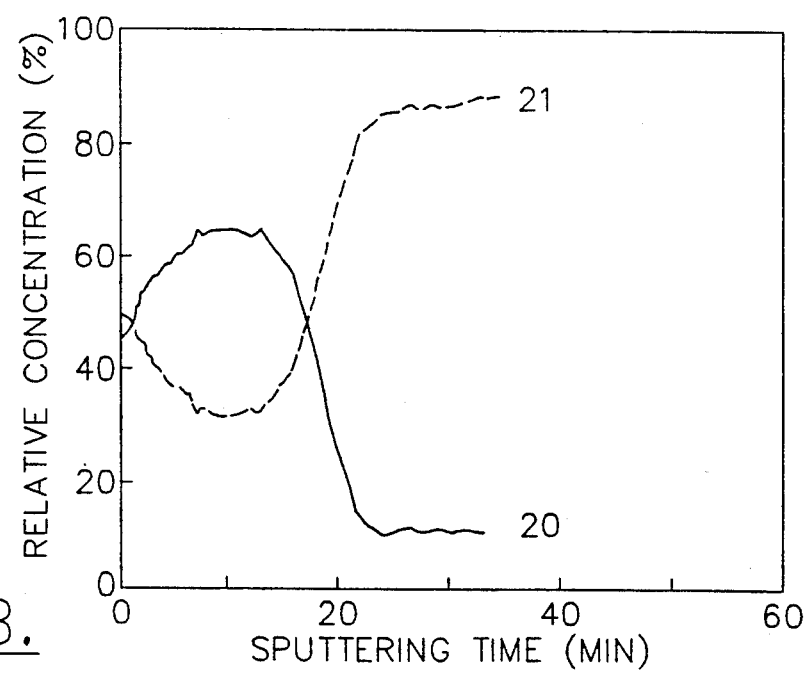
Figure 2C:
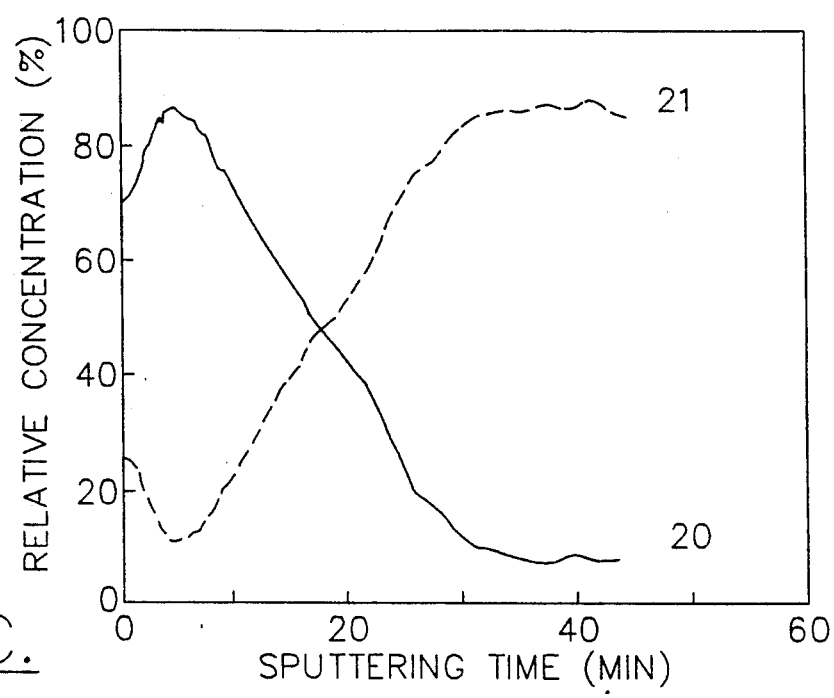
Figure 2D:
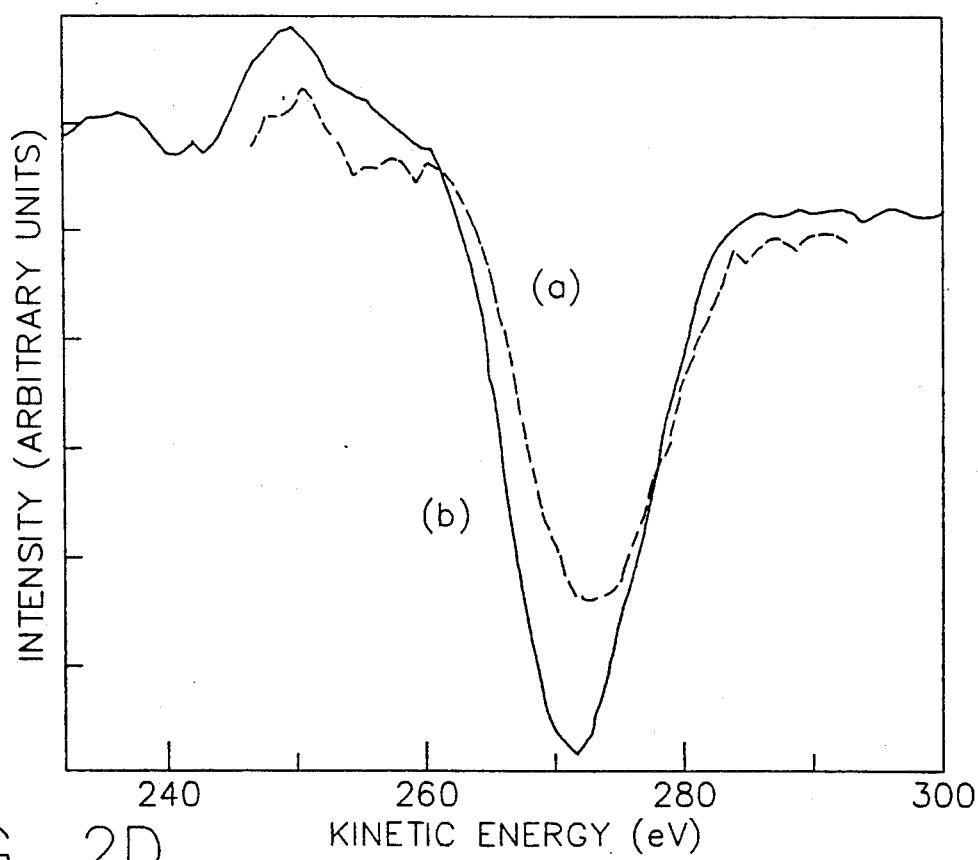

Monocrystalline diamond films may be produced on lattice matched or lattice-plane matched non-diamond substrates. A substrate is lattice matched when the deviation between the lattice constant for the substrate and the lattice constant for diamond is less than 7 percent. Examples of substrates which are latticed matched include copper (lattice constant=3.6153Å) and nickel (lattice constant=3.5238Å). Lattice-plane matched substrates are substrates where the spacing of a set of major planes of the substrate and a set of major planes of diamond are within 7 percent of each other. (see Narayan et al, *On Epitaxial Growth of Diamond Films on (100) Silicon Substrates, Appl. Phys. Lett.* 53(19), Nov. 7, 1988). Examples of lattice-plane matched substrates include iron (lattice constant=2.866Å) and silicon carbide (lattice constant=4.36Å). Substrates which are lattice matched are also lattice-plane matched.

The surface of the substrate is preferably a polished substrate which results in a continuous diamond film being formed. However, the substrate need not be smooth to form a diamond thin film. The use of substrate surfaces which are not smooth results in a diamond thin film which is not smooth. A diamond thin film may be formed on surfaces other than planar surfaces, such as cylindrical surfaces.

Ion implantation may be used to prepare substrates for the formation of the monocrystalline diamond thin film in the present invention. The process of ion implantation involves the acceleration of the ion to be implanted and the subsequent bombardment of the ion to introduce the atoms into the surface layer of a solid substrate. Those skilled in the art will appreciate that various methods of ion implantation are suitable to achieve the appropriate dose and energy levels of the present invention. In general, the C ions are accelerated such that the substrate is bombarded with ions in the 60 keV to 300 MeV energy range (see Mayer et al, *Ion Implantation in Semiconductors,* pages 1-3, (1970)). The resulting ion implanted substrate is characterized by the depth and concentration of the implanted ions. The depth of the ions is reflected by the energy level of the ions in electron volts (eV). The concentration of the ions, or dose, is typically given in ions/cm². Suitable doses range from about $1.0 \times 10^{18}$ to $3.0 \times 10^{18}$. The dose determines the thickness of the film, with thickness being equal to dose/$1.76 \times 10^{23}$ atoms per cubic centimeter. Diamond films with a thickness of 10Å to 2000Å, or more particularly 500Å to 1000Å, may be made by the method of the present invention. These films may be subsequently thickened by CVD in accordance with conventional techniques, as explained below.

An advantage of the instant invention is that atoms of $^{12}C$ alone, $^{13}C$ alone, or any combination thereof may be implanted in the substrate by ion implantation, providing diamond films of very high (greater than 99% and even 99.9%) isotopic purity or very controlled proportion of isotopes.

In addition to the implantation of carbon ions into the substrate, controlled doping of the resulting diamond thin film can also be achieved. P-type dopant ions such as boron (B+) and n-type dopant ions such as phosphorous (P+) and arsenic (As+) can also be implanted in the substrate using known ion implantation techniques. Implanting dopant ions in the region of carbon implantation accurately controls the doping of the resulting diamond thin film.

It is important that the carbon region to be annealed be implanted beneath the surface of the substrate. The result is a non-diamond substrate with carbon implanted within the substrate. Deposition of the carbon on the surface of the substrate, followed by laser annealing, will result in a polycrystalline film. While ion implantation is one suitable means for providing carbon implanted beneath the surface, other suitable means are available. For example, a carbon layer can be formed on the substrate (e.g., copper) by physical vapor deposition, and a second copper layer then formed on the carbon layer by chemical vapor deposition to form a copper substrate having carbon implanted therein.

Laser annealing is employed to create a monocrystalline diamond thin film on the carbon implanted substrate. Laser annealing involves the heating of the ion-implanted layer to the melting point and the subsequent recrystallization of the melted region. See *Laser Processing and Analysis of Materials,* W. W. Duley, Chapter 3, pages 177-184 (1983); Narayan, *Laser Processing of Materials,* Journal of Metals, June 1980. The laser annealing process may be carried out at ambient temperature and in either an air or evacuated environment. The depth to which the substrate is melted is a function of the laser wavelength, energy density and the substrate composition.

As with all laser annealing processes, the parameters of operation of the laser are dependent upon the substrate being used, the type of laser and the level of implantation of the carbon ions. The energy density of the laser depends upon a number of factors including the pulse duration and wavelength of the laser pulse and the reflectivity, absorption coefficient, thermal conductivity and specific heat of the substrate. As the thickness of the carbon implanted region increases, the number of pulses required to melt the implanted region may be increased. Sources of laser light such as argon fluoride ($\lambda = 0.193$ μm), krypton fluoride ($\lambda = 0.248$ μm) and xenon chloride ($\lambda = 0.308$ μm) may be used. Pulse durations of 20 to 60 nanoseconds are typical for pulsed laser annealing. The desired result is obtained by controlling the combination of the above parameters in a manner which yields sufficient energy to melt the implanted region, but insufficient energy to vaporize the implanted region. Alternative techniques such as the use of electron beams, ion beams or continuous wave laser may also be used, so long as sufficiently rapid melting and solidification to obtain the monocrystalline diamond film is achieved. This is primarily accomplished by controlling the residence time of the irradiating beam on the substrate surface to achieve sufficiently rapid melting and solidification (e.g. 100 nanoseconds).

Although we have produced films having a surface area of 1 cm², there is no fundamental limit to the surface area of film which can be produced by this process. Therefore, surface areas of 1 cm², 2 cm², 4 cm² or greater can be produced, either by (a) scanning the irradiating beam across the substrate surface, (b) mechanically translating the substrate surface in front of a stationary beam, (3) increasing the beam energy and diameter, or (d) combinations of the foregoing.

Diamond films and other crystals are characterized by their "defect density", which is the number of defects per square centimeter. Defects counted in calculating defect density are dislocations, precipitates, stacking faults, and twins. Diamond films of the present invention are characterized by defect densities of less than $10^6$ and even less than $10^5$. Due to the low processing temperatures made possible by the instant method, substrates can be chosen for low defect density, and that defect density can remain substantially unchanged through the manufacturing process. Thus, for example, a silicon carbide substrate can be chosen with a defect density less than $10^6$ or less than $10^5$, a monocrystalline diamond film formed on that substrate by the method of the present invention, and the defect density in the substrate of the structure so produced remain essentially the same as found in the starting material. Thus, if the substrate defect density is $10^6$ the diamond film defect density will be $10^6$, if the substrate defect density is $10^5$ the diamond film defect density will be $10^5$, if the substrate defect density is $10^4$ the diamond film defect density will be $10^4$, and so on.

Diamond films produced by the present invention may be subsequently processed by a variety of known techniques. For example, thick single crystal diamond films (e.g. from about 0.5 microns up to 1 to 2 microns or more) may be grown on the resulting thin film diamond substrates using hot filament CVD (HFCVD). The thick diamond film may then be removed from the substrate by any suitable technique, such as chemical etching with nitric acid to provide a monocrystalline diamond film free of substrate material. As another example, a monocrystalline diamond film of any given surface area, as discussed above, can be made, optionally thickened as described above and separated from the substrate as described above to provide a monocrystalline diamond film free of substrate material.

The examples which follow are provided to further illustrate the present invention, and are not to be construed as limiting thereof.

EXAMPLE 1

Provision of Carbon-Implanted Substrates

Polycrystalline and single crystal (100) and (111) specimens of copper (Cu) were chemically polished and implanted with Carbon ions (dose=about $1.0$-$2.0 \times 10^{18}$ ions/cm², energy=about 60-120 KeV). The materials properties of the copper substrate are given in Table 1 below.

TABLE 1

| Thermal and Optical Properties | |
|---|---|
| Thermal conductivity (W/cmK) | $4.1$-$6.5714 \times 10^{-4}(T$-$200)$ for $T < 1357K$; 1.8 for $T > 1357K$ |
| Specific Heat Capacity (J/cm³K) | $3.4496 + 9.75 \times 10^{-4}(T$-$300)$ for $T < 1357K$; 4.4792 for $T > 1357K$. |
| Melting Temperature | 1357K |
| Latent Heat of Fusion (J/cm³) | 1840.05 |

TABLE 1-continued

| Thermal and Optical Properties | |
|---|---|
| Reflectivity | 0.364 (solid) |
| | 0.73 (liquid) |
| Absorption Coefficient (cm⁻¹) | $7.01 \times 10^5$ |

EXAMPLE 2

Laser Annelaing of Carbon-Implanted Substrates

The as-implanted specimens were irradiated with laser pulses to melt and rapidly solidify the implanted regions. The laser parameters used in the present experiments were as follows: wavelength $(\lambda) = 0.308$ μm, pulse duration $(\tau) = 45 \times 10^{-9}$ seconds and energy density from 3.0 to 5.0 J/cm².

FIG. 1 illustrates the variation in melt depth of a carbon implanted copper substrate with variations in energy density of a (wavelength of 0.308 μm) pulsed laser having a pulse width of 45 nS. Copper possesses very high thermal conductivity (4.0 Wcm⁻¹K⁻¹ at 300 K), which decrease steadily with increasing temperature followed by a sharp decrease upon melting of the material. The relatively low plasma frequency of copper allows excellent coupling of the laser energy with the solid. The reflectivity of copper also undergoes a sharp transition upon melting. The slope of the melting curves correspond to the melt-in and solidification velocities of the liquid-solid interface formed after laser irradiation. The surface reaches the melting temperature at very short times, however, more laser energy has to be deposited before the melt interface starts to propagate to inside the bulk of the solid. This delay is due to the sudden increase in the reflectivity of the solid upon melting. The delay in melt propagation is very large (approximately 15 ns at 3 J/cm²) at laser energy densities just above the threshold for melting. The maximum melt depth increases with energy density and changes from approximately 2300Å to 9000Å when energy density is increased from 3 to 5 J/cm². A very interesting feature of this calculation is the extremely high solidification velocities (25-30 m/sec) of copper after the termination of the laser pulse. The extremely high solidification velocities are due to the high thermal conductivity of the solid, the short residence time of the beam and one dimensional heat flow. The diamond phase is envisaged to nucleate during rapid solidification and epitaxial film is formed with the copper substrate providing a seed for crystal growth. While the near surface layers (<1 μm thick) melt during pulsed laser irradiation, the bulk of the substrate remains close to the ambient temperature, thus allowing low-temperature processing of diamond films.

Carbon ion implantation alone, at room temperature as well as at higher temperature (700°-800° C.), did not result in the formation of diamond phase. Annealing by pulsed laser melting and rapid solidification was found to be necessary for the formation of diamond phase.

EXAMPLE 3

Carbon Distribution in Ion-Implanted Substrates Before and After Laser Annelaing FIG. 2 illustrates the distribution with depth of the relative concentrations of the carbon ions 20 and the copper substrate atoms 21 of ion implanted substrates as described in Example 1 above. FIG. 2(a) shows the carbon distribution in the substrate before laser annealing. Depth from the surface is indicated by the Sputtering Time (in minutes), with increased sputtering time corresponding to increased depth into the substrate. FIGS. 2(b) and 2(c) show the carbon distribution after pulsed laser annealing with energy densities of 3 J/cm$^2$ and 5 J/cm$^2$ respectively. Because of the low solubility of carbon in copper, when the substrate is melted by the pulsed laser, the copper and the carbon tend to separate. The separation of the carbon and the copper is indicated in FIG. 2 by the increase in size of the carbon concentration peak. As the substrate is melted to greater depths, a larger portion of the substrate containing carbon ions is melted and thereby freeing the carbon ions to migrate to the surface, thus producing the larger peak shown in FIG. 2(c). Note that any remaining substrate atoms which cover the diamond film after annealing may be removed either by continued irradiation of the substrate or by etching methods known to those skilled in the art.

The Auger results shown in FIG. 2 show the implanted specimens carbon peak is at 700Å, which was found to broaden slightly after laser melting specimens and to attain uniform carbon distribution in the region where diamond film is envisaged to form.

From FIG. 2 it can be seen that a boundary layer is formed between the diamond film and the substrate. The boundary layer has an upper region contacting the diamond film and a lower region contacting the non-diamond substrate where the carbon distribution in the substrate material continuously shifts from a high concentration in the upper region to a low concentration in the lower region. As shown in FIG. 2(b) for an ion implanted copper substrate, laser annealed with an energy density of 3 J/cm$^2$, the upper region of the boundary layer begins at a depth corresponding to a sputtering time of about 15 minutes and the lower region of the boundary layer begins at a depth corresponding to a sputtering time of about 20 minutes. As shown in FIG. 2(c) for an ion implanted copper substrate, laser annealed with an energy density of 5 J/cm$^2$, the upper region of the boundary layer begins at a depth corresponding to a sputtering time of about 10 minutes and the lower region of the boundary layer begins at a depth corresponding to a sputtering time of about 25 minutes. FIG. 2 (d) shows characteristic carbon (a) and diamond (b) spectra. The energy shift between the two curves (a) and (b) and shoulder in the diamond curve provide distinguishing features between the two phases of carbon.

EXAMPLE 4

Characterization of Laser Annealed Substrates Using Raman Measurements

The ion implanted specimens prepared in Example 1 above were studied in detail with Raman measurements techniques. The Raman spectra were recorded using SPEX triple monochromator equipped with photo-multiplier and photon counting electronics. The Raman data was collected in photon counting mode using the 5145Å line from an Ar+ ion laser as excitation source and in 180° backscattering geometry. A slit width of 2 mm was used for macro-Raman measurements on the ion implanted and laser annealed specimens, so peak width of the spectrum is dispersion limited by 2 cm$^{-1}$.

Figure 3:
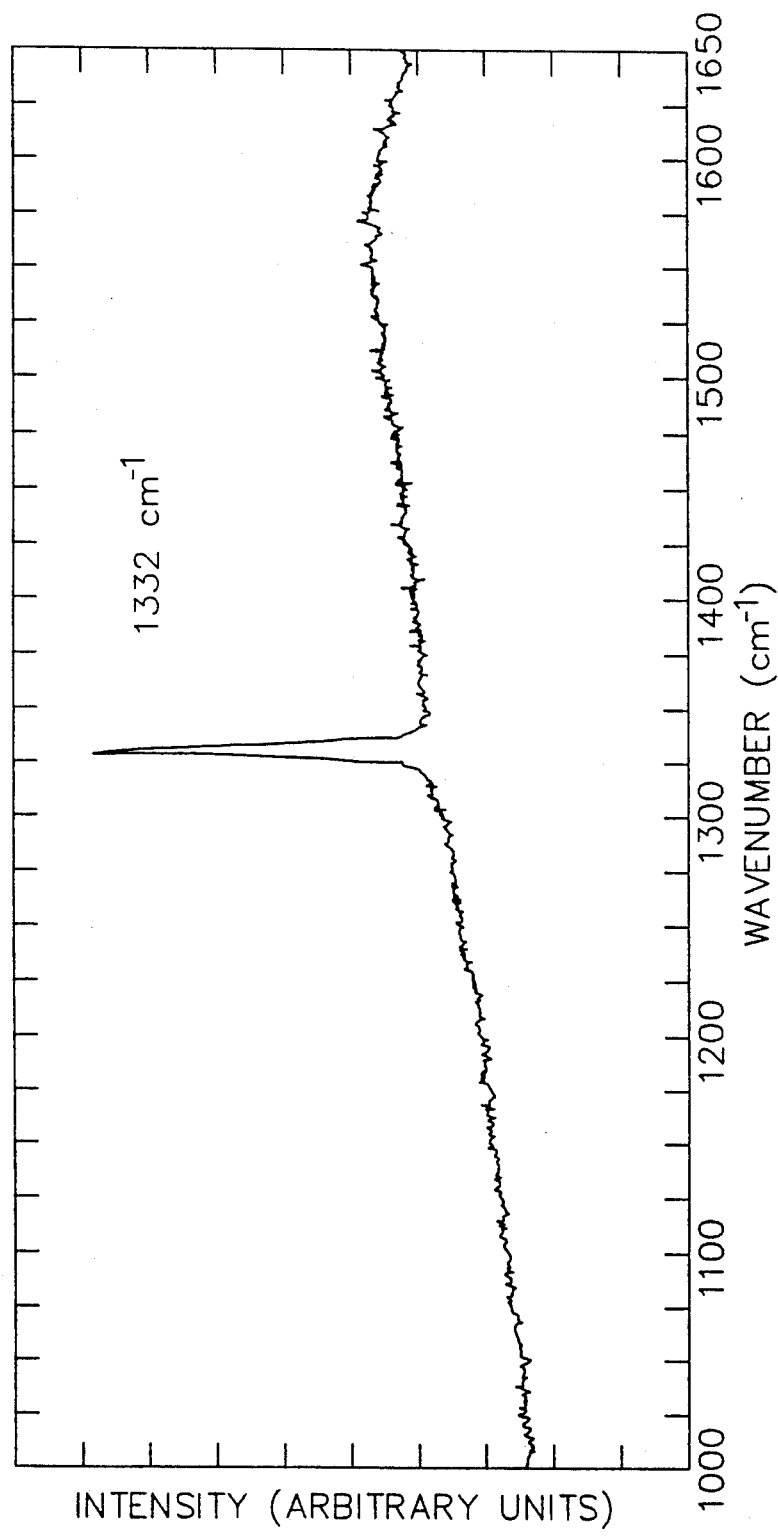
FIG. 3 illustrates the Raman spectra of a monocrystalline diamond thin film produced in accordance with the method of the present invention.

FIG. 3 shows macro-Raman measurements obtained on 2×10 millimeter area of the ion implanted and laser treated copper specimen. The Raman active mode appears at 1332 cm$^{-1}$ with peak width (FWHM) of 5 cm$^{-1}$. Under similar experimental conditions, spectra from (100) single crystal bulk diamond substrates contained peak at 1332 cm$^{-1}$. An absence of peaks at 1550 cm$^{-1}$ (non-diamond Carbon) and at 1133 cm$^{-1}$ (nanocrystalline Diamond) is indicative of a high quality diamond film.

EXAMPLE 5

Characterization of Laser Annealed Substrates Using SEM

Figure 4A:
FIGS. 4a and 4b show scanning electron micrographs at low voltage of 2.0 KeV of (a) smooth film with growth steps; and (b) multiple (5) pulses at 3.0 J/cm² result in film cracking. The micrograph also shows the boundary between laser treated and as-implanted regions.
Figure 4B:
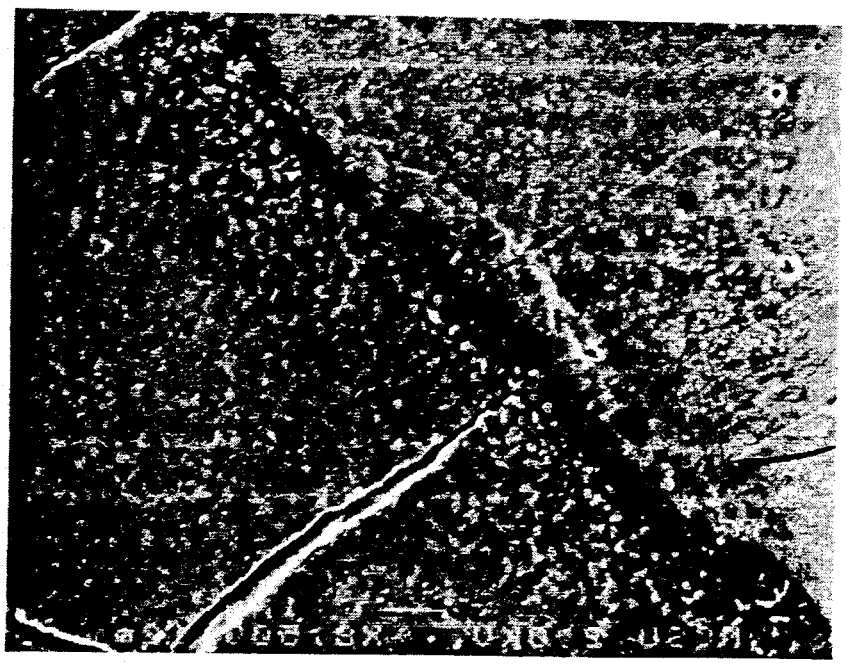

The ion implanted specimens prepared in Example 1 above were studied in detail with low voltage Scanning Electron Microscopy (JEOL-6400 equipped with field emission gun). FIG. 4(a) shows SEM electron micrograph taken at 2.0 KeV, revealing clearly surface features of the diamond film. The surface morphology shows growth steps and confirms the continuous nature of the film. The SEM micrograph in FIG. 4(b) was obtained after multiple laser pulses, which resulted in the formation of cracks in the film. The thermal stresses are generated due to the differences in thermal expansion coefficients between diamond ($\alpha$-linear 5.0×10$^{-6}$ K$^{-1}$) and copper (2.0×10$^{-5}$ K$^{-1}$) at 1273 K, which lead to cracking of the film.

EXAMPLE 6

Characterization of Laser Annealed Substrates Using TEM

The ion implanted specimens prepared in Example 1 above were studied in detail with transmission electron microscopy (Phillips 430, Hitachi S-800, JEOL 200CX).

Figure 5A:
FIGS. 5a and 5b show (a) Moire' fringes but no defects such as twins and stacking faults in a bright field transmission electron micrographs of a film of the present invention; and (b) corresponding selected area diffraction indicating <111> film orientation. The substrate Cu spots are aligned with diamond spots in the diffraction pattern.
Figure 5B:
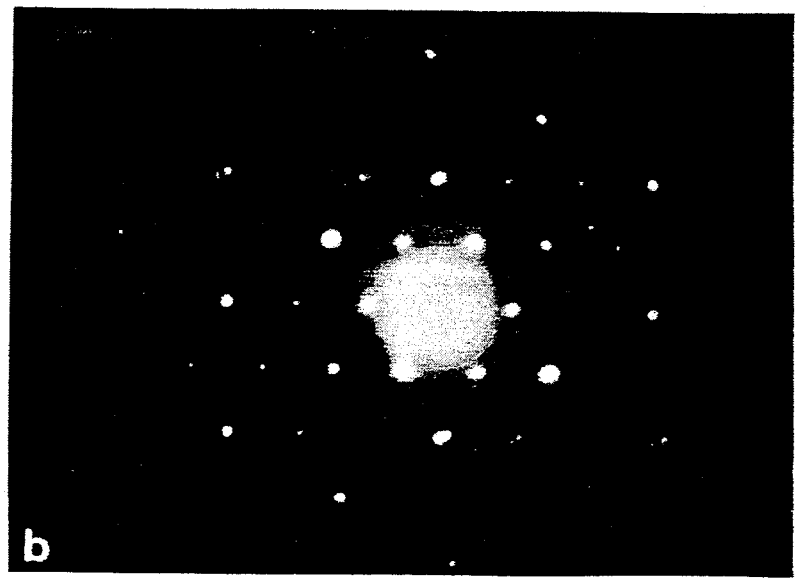

The specimens for TEM were prepared by lifting off the diamond layer on a molybdenum grid using dilute nitric acid. Bright field TEM micrographs of the substrate, shown in FIG. 5, indicate an absence of defects such as twins and stacking faults, which are normally observed in CVD diamond films. The Moire' fringes shown in FIG. 5(a) result from differences in lattice constants between diamond (a$_o$=3.615Å) and copper (a$_o$=3.568Å), in the regions of the film where copper was present underneath the diamond film. FIG. 5(b) shows the corresponding selected area diffraction pattern having a sharp spot pattern characteristic of <110> oriented film. Double diffraction spots also resulted from residual a copper layer on which the diamond layer has grown. The thickness of the diamond film was estimated to be 500Å for an ion implantation dose of 1.0×10$^{18}$ ions/cm$^2$ (thickness=dose/1.76×10$^{23}$ atoms per c.c.).

The foregoing examples are illustrative of the present invention, and are not to be construed as limiting thereof. The invention is defined by the following claims, with equivalents of the claims to be included therein.

That which is claimed is:

1. A method of producing a monocrystalline diamond film on a non-diamond substrate, comprising:
   providing a substrate having a carbon implanted region therein, wherein said substrate is lattice-plane matched with diamond; and then
   annealing said implanted region to rapidly melt and recrystallize substantially all of said implanted region without substantially raising the temperature of the remainder of the substrate to thereby produce a monocrystalline diamond film on said substrate.

2. A method according to claim 1, wherein said non-diamond substrate is a lattice matched substrate.

3. A method according to claim wherein said annealing step comprises a pulsed laser annealing step.

4. A method according to claim 1, wherein said annealing step imparts sufficient energy to melt said implanted region, but insufficient energy to vaporize said implanted region.

5. A method according to claim 1, wherein said annealing step imparts about 3 to 5 J/cm$^2$ of energy into said implanted region.

6. A method according to claim 1, wherein said step of providing a substrate having a carbon implanted-region therein is carried out by ion implanting a region of said substrate with carbon ions.

7. A method according to claim 6, further comprising the step of implanting said non-diamond substrate with dopant ions before said laser annealing step.

8. A method according to claim 6, wherein said ion implanting step comprises ion implantation at a dose of about 1.0 to 3.0 × 10$^{18}$ ions cm$^{-2}$ and an energy of about 60 KeV to 300 MeV.

9. A method according to claim 1, wherein said non-diamond substrate is a chemically polished non-diamond substrate.

10. The method of claim 6, wherein said carbon ions are comprised of ions selected from the group consisting of $^{13}$C and $^{12}$C ions, and wherein said ion implantation is performed such that the isotopic purity of said diamond film is greater than 99 percent.

11. The method of claim 6, wherein said carbon ions are comprised of a combination of $^{12}$C and $^{13}$C ions.

12. A method of producing a monocrystalline diamond film on a non-diamond substrate which is lattice-plane matched with diamond, comprising:
   implanting carbon ions in a region of said non-diamond substrate using ion implantation of a dose of from about 1 to 3 × 10$^{18}$ ions/cm$^2$ with an energy of from about 60 KeV to 300 MeV; and then
   pulsed laser annealing said implanted region with sufficient energy to rapidly melt said implanted region but insufficient to cause vaporization of said implanted region, to produce a monocrystalline diamond film on said substrate.

13. The method of claim 12, wherein said implanting step comprises the steps of:
   depositing carbon ions on said non-diamond substrate; and then
   depositing substrate atoms on said deposited carbon ions.

14. The method of claim 12, wherein said non-diamond substrate is lattice matched with diamond.

15. The method of claim 12, wherein said carbon ions are comprised of ions selected from the group consisting of $^{13}$C and $^{12}$C ions, and wherein said ion implantation is performed such that the isotopic purity of said diamond film is greater than 99 percent.

16. The method of claims 12, wherein said carbon ions are comprised of a combination of $^{12}$C and $^{13}$C ions.

17. A method of producing a monocrystalline diamond film on a non-diamond substrate, comprising:
   (a) providing a solid non-diamond substrate having a top surface portion and a carbon implanted region formed in said top surface portion, and wherein said substrate is lattice-plane matched with diamond; then
   (b) rapidly melting said implanted region formed in said top surface portion by pulsed laser annealing to form a liquid layer comprised of liquid carbon and liquid non-diamond substrte on said solid substrate; and then
   (c) solidifying said liquid layer to form a monocrystalline diamond film on said non-diamond substrate.

18. A method according to claim 17, wherein said surface portion of said implanted region is less than 1 micron thick.

19. A method according to claim 19, wherein said solidifying step is followed by:
   (d) repeating said melting and said solidifying steps on adjacent portions of said substrate to enlarge said monocrystalline diamond film on said non-diamond substrate.

20. A method according to claim 17, wherein said melting step is from about 20 to 60 nanoseconds in duration.

* * * * *

UNITED STATES PATENT AND TRADEMARK OFFICE
CERTIFICATE OF CORRECTION

PATENT NO. : 5,221,411

DATED : June 22, 1993

INVENTOR(S) : Jagdish Narayan

It is certified that error appears in the above-identified patent and that said Letters Patent is hereby corrected as shown below:

Column 3, Line 52, correct "C" to read --$C^+$--.

Column 4, Line 36, correct "Processingof" to read --Processing of--.

Column 10, Claim 17, Line 28, correct "substrte" to read -- substrate --.

Column 10, Claim 19, Line 35, correct "19" to read --17--.

Signed and Sealed this

Twenty-second Day of March, 1994

Attest:

BRUCE LEHMAN

Attesting Officer

Commissioner of Patents and Trademarks